(12) United States Patent
Thackeray et al.

(10) Patent No.: US 6,300,035 B1
(45) Date of Patent: *Oct. 9, 2001

(54) CHEMICALLY AMPLIFIED POSITIVE PHOTORESISTS

(75) Inventors: James W. Thackeray, Braintree; Peter R. Hagerty, Mansfield; James F. Cameron, Boston, all of MA (US); Wu-Song Huang; Ahmad D. Katnani, both of Poughkeepsie, NY (US); Willard E. Conley, San Jose, CA (US)

(73) Assignees: Shipley Company, L.L.C., Marlborough, MA (US); International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/128,797

(22) Filed: Aug. 4, 1998

Related U.S. Application Data

(63) Continuation of application No. 08/567,630, filed on Dec. 5, 1995, now Pat. No. 5,879,856.

(51) Int. Cl.$^7$ .............................. G03F 7/004; G03F 7/30
(52) U.S. Cl. .................................. 430/270.1; 430/271.1; 430/326; 430/910
(58) Field of Search ..................... 430/270.1, 271.1, 430/326, 910

(56) References Cited

U.S. PATENT DOCUMENTS

| | | |
|---|---|---|
| 4,491,628 | 1/1985 | Ito et al. .............................. 430/176 |
| 5,164,278 | 11/1992 | Brunsvold et al. .................. 430/176 |
| 5,258,257 | 11/1993 | Sinta et al. ........................... 430/192 |
| 5,344,742 | 9/1994 | Sinta et al. ........................ 430/270.1 |
| 5,393,642 * | 2/1995 | DuBois et al. ....................... 430/170 |
| 5,403,695 | 4/1995 | Hayase et al. ....................... 430/192 |
| 5,525,453 | 6/1996 | Przybilla et al. .................... 430/170 |
| 5,556,734 | 9/1996 | Yamachika et al. .............. 430/270.1 |
| 5,558,971 * | 9/1996 | Urano et al. ......................... 430/170 |
| 5,629,135 | 5/1997 | Kobayashi et al. .............. 430/270.1 |

FOREIGN PATENT DOCUMENTS

| | | |
|---|---|---|
| 44 08 318 A1 | 9/1994 | (DE) . |
| 0 412 457 A1 | 2/1991 | (EP) . |
| 0 505 094 | 9/1992 | (EP) . |
| 92116406 | 9/1992 | (EP) . |
| 0 611 998 A2 | 8/1994 | (EP) . |
| 0 633 502 A1 | 1/1995 | (EP) . |
| 0 677 788 A1 | 10/1995 | (EP) . |

OTHER PUBLICATIONS

Patent Abstracts of Japan, vol. 18, No. 273 (P–1742), May 24, 1994 & JP 06 043653 A (Nippon Telegr. & Teleph. Corp.).

* cited by examiner

*Primary Examiner*—John S. Chu
(74) *Attorney, Agent, or Firm*—Peter F. Corless; Darryl P. Frickey; Edwards & Angell, LLP

(57) ABSTRACT

Photoresist compositions are provided comprising 1) a resin binder having photoacid-labile groups, 2) an acid generator and 3) a photospeed control agent. Photoresists of the invention exhibit good photospeed and can provide highly resolved relief images of small dimensions, including lines of sub-micron and sub-half micron dimensions with at least essentially vertical side walls. Methods are also provided that include control of photospeed of a photoresist composition of the invention.

20 Claims, No Drawings

CHEMICALLY AMPLIFIED POSITIVE PHOTORESISTS

This application is a continuation of application Ser. No. 08/567,630 filed on Dec. 5, 1995 U.S. Pat. No. 5,879,856.

BACKGROUND OF THE INVENTION

1. Field of the Invention

This invention relates to new photoresist compositions particularly suitable for deep U.V. exposure and having the capability of forming highly resolved features submicron dimension.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

More recently, certain "chemically amplified" photoresist compositions have been reported. Such photoresists may be negative-acting or positive-acting and rely on many crosslinking events (in the case of a negative-acting resist) or deprotection reactions (in the case of a positive-acting resist) per unit of photogenerated acid. In other words, the photogenerated acid acts catalytically. In the case of the positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl or imide, which results in different solubility characteristics in exposed and unexposed areas of the resist coating layer.

An important property of a photoresist is image resolution. A developed photoresist image of fine line definition, including lines of sub-micron and sub-half micron dimensions and having vertical or essentially vertical sidewalls is highly desirable to permit accurate transfer of circuit patterns to an underlying substrate. However, many current photoresists are not capable of providing such highly resolved fine line images.

Another important property of a photoresist is photospeed, which can be defined as the exposure time coupled with the exposure energy required to activate the photoactive component, e.g. to generate the required amount of photoacid to provide the desired solubility differential between exposed and unexposed areas of a photoresist coating layer.

It can be critical that a resist's photospeed is within an acceptable and consistent range or value to permit desired processing of the resist. For instance, sufficiently high photospeed is important in many processes, e.g. where a number of exposures are needed such as in generating multiple patterns by a step and repeat process, or where activating energy of reduced intensity is employed. Sufficiently high photospeed also permits reduction in the concentration of the radiation sensitive component in the photoresist. On the other hand, a resist that is "too fast", i.e. has too high photospeed, can be undesirable. For example, an extremely high photospeed may compromise resolution of the patterned resist image and/or exposure equipment may not be well suited to image fast resists.

Moreover, a consistent photospeed of a resist can be critical, e.g. so that a device manufacturer can use the same imaging conditions and obtain consistent results despite lot-to-lot differences of a resist product (such as precise amount and/or nature of photoactive compound, resin, etc.) that may frequently occur, particularly in large scale resist manufacturing processes. However, many current resists do not exhibit such consistent photospeed, and consequently a device manufacturer may either realize inconsistent results as different lots of a resist formulation are used, or the device manufacturer may be forced to carefully test the photospeed of each new lot of resist and then adjust the parameters of the exposure equipment to provide for consistent processing. Clearly, either alternative is undesirable.

Relatively recently interest has increased in photoresists that can be photoimaged with deep U.V. radiation. Such photoresists offer the potential of forming images of smaller features than may be possible at longer wavelength exposure. As is recognized by those in the art, "deep U.V. radiation" refers to exposure radiation having a wavelength in the range of about 350 nm or less, more typically in the range of about 300 nm or less. While a number of deep U.V. resists have been reported, the need clearly exists for new deep U.V. resists that can provide highly resolved fine line images as well as acceptable photospeed and other lithographic properties.

It thus would be desirable to have new chemically amplified photoresist compositions that could provide highly resolved fine line images, including images of sub-micron and sub-half micron dimensions. It would be further desirable to have such new photoresist compositions that could be imaged with deep U.V. radiation. It would be particularly desirable to have such a chemically amplified photoresist where the resist's photospeed was capable of being carefully controlled to a specific value or narrow range of values.

SUMMARY OF THE INVENTION

The present invention provides new photoresist compositions that in general comprise 1) a resin binder having photoacid labile groups, 2) an acid generator and 3) a photospeed control agent.

It has been found that photoresists of the invention can provide highly resolved relief images of small dimensions, including lines of sub-micron and sub-half micron dimensions with vertical or essentially vertical side walls.

It also has been surprisingly found that the photospeed control agent imparts an acceptable photospeed to resists of the invention.

Moreover, the photospeed control agent enables providing a consistent photospeed of the resist. That is, the photospeed of a particular resist composition of the invention can be precisely fixed at a specified value by use of the photospeed control agent. This is a significant advantage as photospeed differences between production lots of the resist can be compensated for by use of the photospeed control agent to provide uniform photospeed. In this regard, the invention includes methods for providing a consistent photospeed of the resist compositions of the invention, which comprise adjusting the photospeed of a resist composition to a desired value by altering the concentration of the photospeed control agent in the composition.

The photospeed control agent is preferably a strong base, particularly an organic amine, and more preferably is an organic salt of a strong base. Ammonium and phosphonium are particularly preferred bases to use in salt form. Especially preferred are salts of a compound substituted by hydroxy and carbonyl such as a lactate salt as well as sulfonyl salts such as a triflate or tosylate. It has been found that a photospeed control agent counter ion that is a hydroxy-substituted alkanoyl provides better performance results than a comparable composition that includes a counter ion of a photospeed control agent that is an alkanoyl without hydroxy substitution.

Phenolic resins are generally preferred resin binders of resists of the invention. Particularly preferred are copolymers of vinyl phenol and other copolymerizable group(s), especially where the acid labile groups are present substantially, essentially or completely only on non-phenolic units of the copolymer. Preferred copolymer binders include copolymers that comprise substituted or unsubstituted phenol(s) and one or more alkylacrylates such as t-butylacrylate or t-butylmethacrylate. Non-phenolic resin binders are also suitable, e.g. copolymers of one or more alkyl acrylates and vinyl alicyclics. Preferred acid labile groups are pendant from the resin binder backbone.

Another preferred component of resist compositions of the invention is a dye compound. Preferred dyes will enhance resolution of the patterned resist image, typically by reducing reflections and the effects thereof (e.g. notching) of the exposure radiation, while permitting efficient imaging. Preferred dyes of compositions of the invention include substituted and unsubstituted phenothiazine, phenoxazine, anthracene and anthrarobin compounds as well as copolymers thereof such as an anthracene acrylate copolymer.

The invention also provided methods for forming relief images of the photoresist compositions of the invention, including methods for forming highly resolved patterned photoresist images (e.g., a patterned line having essentially vertical sidewalls) of sub-micron or sub-half micron dimensions. The invention further provides articles of manufacture comprising substrates such as a microelectronic wafer or a flat panel display substrate having coated thereon the photoresists and relief images of the invention.

Other aspects of the invention are disclosed infra.

DETAILED DESCRIPTION OF THE INVENTION

The resin binder component of the photoresists of the invention suitably contains phenol units and has acid labile groups, typically pendant from the resin backbone, and typically used in a resist composition of the invention in an amount sufficient to render an exposed coating layer of the resist developable such as with an aqueous alkaline solution. Exemplary phenolic resins containing such acid labile groups are disclosed in the above mentioned patents such as U.S. Pat. No. 4,491,628 to Ito as well as in U.S. Pat. No. 5,258,257 to Sinta et al. Such resins can be prepared by alkaline condensation of the preformed phenolic resin with a compound that comprises the acid labile group and a suitable leaving group. For example, to provide acetate acid labile groups pendant to the resin binder backbone, the preformed resin binder may be condensed with a compound of the formula L—CR$^1$R$^2$C(=O)—O—R$^3$, where L is a leaving group such as bromide or chloride, R$^1$ and R$^2$ are each independently hydrogen, an electron withdrawing group such as halogen (particularly F, Cl or Br), or substituted or unsubstituted C$_{1-10}$ alkyl; and R$^3$ is substituted or unsubstituted C$_{1-10}$ alkyl, or substituted or unsubstituted aryl such as phenyl or aryalkyl such as benzyl. The condensation provides the groups of the formula —CR$^1$R$^2$C(=O)—O—R$^3$ pendant to the resin binder backbone and grafted onto the resin's available hydroxyl groups. Photoacid degradation of those groups during exposure and/or post-exposure heating provides the polar acetic acid ether moiety pendant to the resin binder backbone. Other acid labile groups of course also may be employed, e.g. oxycarbonyl groups such as those of the formula —C(=O)OR$^3$ where R$^3$ is as defined above and preferably is t-butyl or benzyl. See also U.S. Pat. No. 5,258,257 to Sinta et al. for a discussion of acid labile groups and preparation and use of resist resin binders comprising acid labile groups.

It is generally preferred that the resin binder is a copolymer of vinyl phenol and other copolymerizable group(s). Preferred copolymers comprise units of substituted or unsubstituted phenols and non-aromatic groups, particularly copolymers of vinyl phenols and alkyl acrylates, typically C$_{1-12}$ alkyl acrylates. Particularly preferred are copolymers of vinyl phenols and acrylates having branched alkyl chains, such as copolymers formed from t-butyl acrylate, t-butyl methacrylate, etc.

As mentioned above, it is preferred to have acid labile groups substantially or completely only on non-phenolic or other non-aromatic units of the copolymer binder. One especially preferred copolymer binder has repeating units x and y of the following formula:

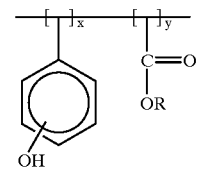

wherein the hydroxyl group be present at either the ortho, meta or para positions throughout the copolymer, and R is substituted or unsubstituted alkyl having 1 to about 18 carbon atoms, more typically 1 to about 6 to 8 carbon atoms. Tert-butyl is a generally preferred R group. An R group may be optionally substituted by e.g. one.or more halogen (particularly F, Cl or Br), C$_{1-8}$ alkoxy, C$_{2-8}$ alkenyl, etc. The units x and y may be regularly alternating in the copolymer, or may be randomly interspersed through the polymer.

Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R—O—C(=O)—, moiety of the acrylate units serves as the acid labile groups of the resin and will undergo photoacid induced cleavage upon exposure of a coating layer of a photoresist containing the resin. Preferably the copolymer will have a M$_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be prepared by such free radical polymerization or other known procedures and suitably will have a M$_w$ of from about 8,000 to about 50,000, and a molecular weight distribution of about 3 or less.

The photoresist compositions of the invention also comprise a photospeed control agent. The photospeed control agent is a strong base in non-salt form, particularly a base having a $pK_a$ of about 10 or greater, more preferably a $pK_a$ of about 10.5 or 11 or greater. When complexed as a salt as disclosed herein, the photospeed control agent will have a lower $pK_a$, e.g. a $pK_a$ of about 9 or less, more typically from about 5 to 9. As used herein, the term "$pK_a$" is used in accordance with its art recognized meaning, that is, $pK_a$ is the negative log (to the base 10) of the dissociation constant of the polar compound in aqueous solution at about room temperature.

Organic bases are generally preferred photospeed control agents, particularly organic amines such as a tetra-alkylammonium compound, e.g. tetrabutylammonium hydroxide (TBAH).

Even more preferred is to use a salt as a photospeed control agent, particularly a salt of an organic acid such as salt of lactic acid, succinic acid, citric acid, etc. A lactate salt is generally preferred, particularly a lactate salt of an organic amine such as a tetrabutylammonium compound or other tetraalkylammonium agent. Sulfonyl salts are also preferred such as a triflate or tosylate. Ammonium and phosphonium are preferred bases to use in salt form. It has been found that resolution of resist relief images of the invention will be even further enhanced by use of such a salt as a photospeed control agent relative to a comparable composition that contains the agent in non-salt form.

One preferred group of photospeed control agents of the invention have a formula of $N(R^1)_4A$, where each $R^1$ is independently substituted or unsubstituted alkyl preferably having from 1 to about 12 carbon atoms, more typically 1 to about 8 carbon atoms, or a substituted or unsubstituted aryl such as a $C_{6-10}$ aryl e.g. phenyl, naphthyl and the like; and A is a counter anion of a halide, a substituted or unsubstituted hydroxyalkanoyl preferably having 1 to about 18 carbon atoms (i.e. a group substituted by hydroxy and carbonyl such as lactate—$CH_3CH(OH)C(=O)0^-$), substituted or unsubstituted sulfonate including a $C_{6-18}$ aryl or $C_{1-12}$ alkyl sulfonate. The term hydroxyalkanoyl as used herein refers to an alkanoyl group having one or more hydroxy moieties (typically 1, 2, 3 or 4 hydroxy moieties) on one or more carbons of the alkanoyl group. Exemplary sulfonate A groups include mesylate, triflate, tosylate, etc. Substituted A groups may be suitably substituted by one or more groups such as halo particularly fluoro, chloro and bromo, hydroxy, cyano, nitro, $C_{1-12}$ alkyl, $C_{2-12}$ alkenyl, $C_{1-12}$ alkoxy, $C_{1-12}$ alkanoyl including acyl, etc.

As discussed above, a phosphonium compound also may be employed as a photospeed control, including phosphonium salts such as e.g. compounds of the formula $P(R^1)_4A$ where $R^1$ and A are each the same as defined above for the formula $N(R^1)_4A$.

Such salts of a photospeed control agent can be readily prepared by known procedures, e.g., by dissolving the free base in an aqueous solution containing the acid and then removing solvent or, alternatively, reacting the free base and acid in an organic solvent such as chloroform or the like and then isolating the salt. The photospeed control agent in salt or non-salt form, as well as all other components of a resist composition of the invention, should be soluble in the resist organic solvent carrier(s) so as to provide a formulation that is at least essentially particle-free. See also the examples which follow.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are of the following formulae I and II:

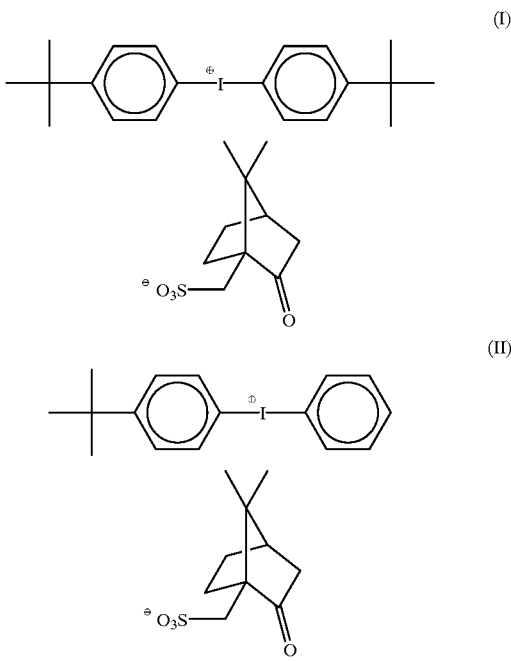

Such sulfonate compounds can be prepared in accordance with the following scheme which depicts the synthesis of a compound of formula I. See also Example 2 which follows for synthesis of that PAG. The PAG of formula II can be prepared as generally depicted in the below Scheme and Example 2, except approximately molar equivalents of t-butyl benzene and benzene would be reacted together in the first step with acetic anhydride and $KIO_3$.

Scheme

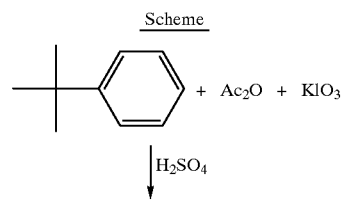

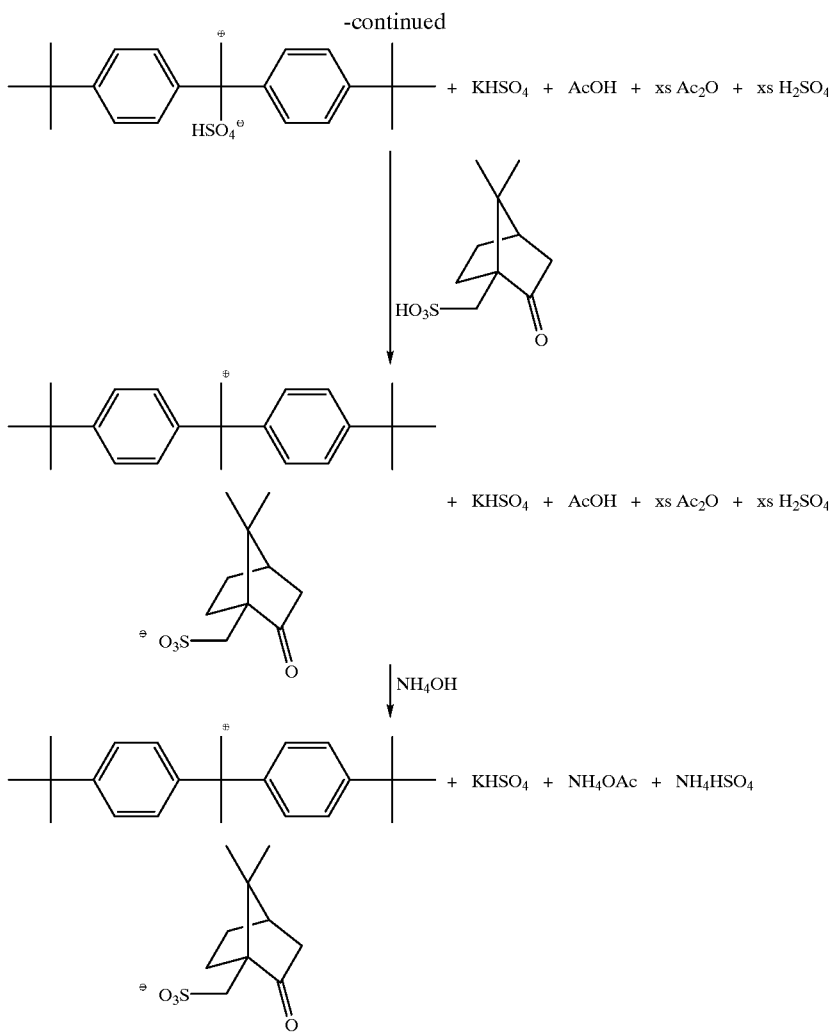

Sulfonated esters including sulfonyloxy ketones are also preferred PAGs of resist compositions of the invention. Suitable sulfonated esters have been reporting in J. of Photopolymer Science and Technology, vol. 4, No. 3,337-340 (1991), incorporated herein by reference, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts are also generally preferred acid generators of compositions of the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generator include the family of nitrobenzyl esters, and the s-triazine derivatives. Suitable s-triazine acid generators are disclosed, for example, in U.S. Pat. No. 4,189,323.

Non-ionic photoacid generators are suitable including halogenated non-ionic, photoacid generating compounds such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o(3,5,6-trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972.

Acid generators that are particularly preferred for deep U. V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2trichloroethanol; tris(1,2,3-methanesulfonyl)benzene; and tris(trichloromethyl)triazine.

Another preferred component of resist compositions of the invention is a dye compound. Preferred dyes will enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. See for instance Example 5 which follows. A curcumin dye also may be used for some applications. In addition to reducing reflections in deep U.V. exposures, use of a dye may expand the spectral response of the compositions of invention.

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl ethyl ketone. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components. The photospeed control agent can be employed in relatively small amounts, e.g. about 1% to 20% by weight relative to the PAG.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

In accordance with the invention, after formulation of the resist, a sample of the resist can be tested for its photospeed and the photospeed adjusted, if needed, to provide a photospeed of a desired value by altering the concentration of the photospeed control agent in the resist formulation. For example, if the resist photospeed is too high, an additional amount of the control agent can be added to the formulation, and a further sample tested to ensure the resist then exhibits the desired photospeed. The photospeed of a resist of the invention can be determined by procedures well known to those in the art, such as the procedure disclosed in U.S. Pat. No. 4,618,233 to Hertlein. A resist composition of the invention preferably will contain a sufficient concentration of the photospeed control agent so that only a 3 percent or less, or more preferably about 1 to 2 percent or less, difference in photospeed exists between lots or batches.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 $mJ/cm^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

All documents mentioned herein are incorporated herein in their entirety by reference.

The following non-limiting examples are illustrative of the invention.

EXAMPLE 1

Preparation of Photospeed Control Agent of Tetra-n-butylammonium d/l-lactate Salt [$(CH_3CH_2CH_2CH_2)_4NO(CO)CH(OH)CH_3$]

To a solution of tetra-n-butylammonium bromide (16.12 g, 50.0 mmol) in water (50 ml) was added a gray colored suspension of silver lactate (9.85 g, 50.0 mmol) in water (100 ml). As the addition proceeded a grayish white solid, presumably silver bromide, precipitated from solution. The resulting suspension was stirred at room temperature for 15 hours, the solid was filtered off and washed with water (3×50 ml). The combined filtrate and washings were concentrated under reduced pressure and the residual oil dried in vacuo at 50° C. for 24 hours to give the title compound as a colorless oil (16.62 g, 99%). Upon standing at room temperature, this oil later formed a waxy semi-solid.

EXAMPLE 2

Preparation of di-(4-t-butylphenyl)iodonium (+/−)-10-camphor Sulfonate (compound of formula I above)

A 2L 3 neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for a further 22 hours. The reaction mixture was cooled to 5–10° C. and water (600 ml) was added dropwise over @ 30 minutes, maintaining the temperature below 30° C. (Note the first @ 75 ml should be added at a particular slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2L separating funnel and the aqueous solution of diaryliodonium hydrogensulfate transferred to a 3L reaction vessel. The solution is cooled to 5–10° C., (+/−)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (1L) and washed with dilute ammonium hydroxide (2.5 wt %, 5 ml 14.8 N $NH_4OH$+195 ml $H_2O$) until the washings are in the pH 7–8 range (1×200 ml) and then water (2×200 ml) to restore the pH to around 7. After drying ($MgSO_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@ 375 g PAG in @ 1150 ml IPA) in a 2L RBF to give a homogeneous dark red solution. The hot solution was transferred to a 2L conical flask and allowed to cool. While this solution is still warm, hexane (500 ml) was added and crystals form soon after. The crystallizing mixture was allowed to cool to room temperature and stored for 4 hours. The crystallizing solution was cooled to @ 5° C. in an ice-water bath for 1.5 hours and then the solid is collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (title compound; photoactive active compound of formula I was isolated as a free flowing white powder. At this stage about 285 g of PAG is obtained. A second recrystallization can be performed in a similar manner.

EXAMPLE 3–4

In the following Example 3, a photoresist composition of the invention was prepared that contained as a lactate salt of TBAH, prepared as described in Example 1 above. In Example 4, a comparable resist was prepared which did not contain TBAH lactate or any other photospeed control agent. As can be seen by comparison of the results of Examples 3 and 4, use of a photospeed control agent can increase substantially resolution of a patterned resist image. In each of Examples 3 and 4, the resin binder was a copolymer of vinyl phenol and t-butylacrylate, having a MW of about 20,000 and available under the tradename of Maruzen CTBA 161 from Maruzen Oil Company of Tokyo, Japan. The leveling agent used in each of the examples is the commercially available material sold under the name Silwet™ L-7604 by Union Carbide. The photoacid generator (PAG) used in the examples below is the sulfonate salt of Example 2 and formula I above. Ethyl lactate was the solvent used in each of the Examples 3–4.

EXAMPLE 3

A resist formulation was prepared by admixing the following components in the following amounts:

| Components | Amount (expressed in grams) |
| --- | --- |
| Resin binder | 4.369 |
| PAG | 0.131 |
| Photospeed control agent | 0.013 |
| Leveling agent | 0.023 |
| Solvent | 30.311 |

This resist formulation was spin coated onto hexamethyldimethylsilane treated silicon wafers at 3000 rpm for 30 seconds. After soft-baking for 60 seconds at 150° C. on a vacuum hot plate a tack-free resist film was obtained. The resist film was then exposed to deep U.V. exposure wavelength using a GCA Excimer laser and stepper NA 0.35 (Eo=5.32 mj/cm$^2$; Es=13.3 mj/cm$^2$ with Es/Eo=2.5). After exposure the resist film was baked at 150° C. for 90 seconds followed by immersion development in 0.26N aqueous tetramethylammonium hydroxide solution for 60 seconds. A relief image was obtained resolved to a dimension of 0.32 microns with square (vertical sidewalls) profile.

EXAMPLE 4

A resist formulation was prepared by admixing the following components in the following amounts:

| Components | Amount (expressed in grams) |
| --- | --- |
| Resin binder | 9.500 |
| PAG | 0.285 |
| Leveling agent | 0.049 |
| Solvent | 41.897 |

This resist formulation coated onto silicon wafers as described in Example 3 above. After soft-baking for 60 seconds at 150° C. on a vacuum hot plate a tack-free resist film was obtained. The resist film was then exposed to deep U.V. exposure wavelength using a GCA Excimer laser and stepper NA 0.35 (Eo=0.59 mj/cm$^2$; Es=0.71 mj/cm$^2$ with Es/Eo=1.2). After exposure the resist film was baked at 150° C. for 90 seconds followed by immersion development in 0.26N aqueous tetramethylammonium hydroxide solution for 60 seconds. A relief image was obtained to a dimension of 0.40 microns with undercutting and ragged profiles.

EXAMPLE 5

Photoresists Containing a Dye

Four different photoresists (resists A–D below) were prepared by admixing the specified components. The resin binder for each of the resists was a copolymer of vinyl phenol and t-butylacrylate, having a $M_w$, of about 20,000 and available under the tradename of Maruzen KE-610 from Maruzen Oil Company of Tokyo, Japan. Other resist composition components, including the dye compound, are indicated below.

Photoresist A 15.209% polymer KE-610 (38% t-butyl acrylate/62% hydroxystyrene copolymer), 0.456% photo acid generator (di t-butylphenyl iodonium camphor sulfonate formula I above); 0.30% photospeed control agent (tetrabutyl ammonium hydroxide), 0.080% leveling agent (Silwet™ L-7604), 0.304% dye (9-anthracenemethyl methacrylate/2-hydroxyethyl methacrylate copolymer, 50/50 w/w) and 83.920% ethyl lactate.

Photoresist B 15.209% polymer KE-610 (38% t-butyl acrylate/62% hydroxystyrene copolymer), 0.456% photo acid generator (di t-butylphenyl iodonium camphor sulfonate (formula I above); 0.30% photospeed control agent (tetrabutyl ammonium hydroxide), 0.080% leveling agent (Silwet™ L-7604), 0.304% dye (2-acetylphenothiazine) and 83.920% ethyl lactate.

Photoresist C 15.209% polymer KE-610 (38% t-butyl acrylate/62% hydroxystyrene copolymer), 0.456% photo acid generator (di t-butylphenyl iodonium camphor sulfonate formula I above; 0.30% photospeed control agent (tetrabutyl ammonium hydroxide), 0.080% leveling agent (Silwet™ L-7604), 0.304% dye (Anthrarobin) and 83.920% ethyl lactate.

Photoresist D 14.787% polymer KE-610 (38% t-butyl acrylate/62% hydroxystyrene copolymer), 0.444% photo acid generator (di t-butylphenyl iodonium camphor sulfonate formula I above), 0.30% photospeed control agent (tetrabutyl ammonium hydroxide), 0.080% leveling agent (Silwet™ L-7604), 0.739% dye (Curcumin) and 83.920% ethyl lactate.

The resists were spun cast onto 4" YES oven HMDS primed silicon wafers and soft baked for 60 seconds at 140° C. (vacuum contact) on a GCA MicroTrac coat/bake track system. Coated wafers were then exposed with a GCA Excimer Stepper (fitted with a 0.53NA lens) using a focus/exposure array. Next, wafers were post exposure baked for 90 seconds at 140° C. (vacuum contact) and developed using a 25 second/25 second double-spray puddle process on a GCA MicroTrac system using Shipley Megaposit CD-26 developer (0.26N aqueous tetramethylene ammonium hydroxide developer containing a leveling agent). Imaging conditions and resolution of the developed relief images are set forth in Table I below for each of the Resists A–D.

TABLE 1

| Resist | Eo, mJ | Esize, mJ | % UFTL | Resolution, $\mu$m | Masking Linearity, $\mu$m | Focus Latitude, $\mu$m | Exposure Latitude |
|---|---|---|---|---|---|---|---|
| A | 5.6 | 14.0 | 2.23 | 0.23 | 0.23 | 1.2 | ±12.3% |
| B | 9.0 | 21.0 | 2.07 | 0.24 | 0.24 | 1.0 | ±10.5% |
| C | 4.8 | 12.0 | 2.16 | 0.23 | 0.23 | 1.2 | ±18.8% |
| D | 5.4 | 13.0 | 3.20 | 0.24 | 0.24 | 1.0 | ±7.9% |

EXAMPLE 6

In the following Example 6, the effect of use of a photospeed control agent was further examined. Each of the photoresist compositions of this example (identified as Resists 1–5 below) contained a resin binder in the same relative amount that was a copolymer of vinyl phenol and t-butylacrylate, having a $M_w$, of about 20,000 and available under the tradename of Maruzen CTBA 161 from Maruzen Oil Company of Tokyo, Japan. The photoacid generator (PAG) used in the compositions of the examples was the sulfonate salt of Example 2 and formula I above. Ethyl lactate was the solvent used in each of the compositions.

As specified in Table 2 below, the respective resist compositions contained either no photospeed control agent (P.C.A. in Table 2), or a photospeed control agent of tetrabutylammonium acetate (TBAOAc), tetrabutylammonium tosylate (TBAOTs), tetrabutylammonium triflate (TBAOTf) or tetrabutylammonium lactate (TBAL). The $pK_a$ values of the photospeed control agents used in each of resists 1–5 are also shown in Table 2.

The resist compositions were prepared by formulating ethyl lactate solutions containing the resin binder, the PAG at 4% weight of the resin binder, and the photospeed control agent (if present) at 9.6 $\mu$mol/g of the resin binder. All formulations were passed through Gelman Acro 0.2 $\mu$m filters prior to use.

Separate wafers were coated with the resist compositions as described in Example 3 above and the coated wafers were exposed on a GCA XLS DUV stepper (KrF laser, NA=0.53, wavelength=248.4 nm) and postbaked at 140° C. for 90 seconds. The resists were developed with CD-26 using a 25/35 a double spray puddle process.

The energy to clear (EO in Table 2) was defined as the exposure dose necessary to remove the resist film upon development. Energy to size (Esize in Table 2) values were determined for 0.3 $\mu$M features as measured at the base of the resist image. Exposure and focus latitude values (EL and FL respectively in Table 2 below) were measured for 0.3 $\mu$m features and were defined as the change in exposure dose or focus needed to effect a ±10% change in linewidth. Linear resolution (Lin. Res. in Table 2) was defined as the size of the smallest feature within ±10% of the nominal linewidth. Resolution (Res. in Table 2) was defined as the nominal linewidth of the smallest open feature.

Transmission IR spectra of the coated silicon wafers were obtained on a Mattson Polaris FT-IR spectrometer using 64 scans at 4 cm$^{-1}$ resolution. IR contrast was defined as the change in magnitude of the 1150 cm$^{-1}$ absorbance of the resin binder divided by the change in log exposure dose.

Chemical and lithographic data for each of the tested resists are summarized in Table 2 below. In all cases, the presence of the photospeed control agent results in improved resist performance. Moreover, the best results were obtained using the hydroxy-substituted TBAL-containing resist, which has the best chemical contrast, exposure latitude, focus latitude, and ultimate resolution. In addition, that resist gave the smoothest, squarest profiles. The other resists showed considerably more roughness and irregularity, especially at the tops of the dense features.

TABLE 2

| Resist No. | P.C.A. | pK$_a$ | IR contrast | EO mJ/cm$^2$ | Esize mJ/cm$^2$ | Esize/EO | EL | FL μm | Lin. Res. μm | Res. μm |
|---|---|---|---|---|---|---|---|---|---|---|
| 1 | None | — | -0.69 | 1.0 | dense: 1.8 iso: 1.9 | dense: 1.8 iso: 1.9 | dense: 19% iso: 12% | dense: 0.79 iso: 0.75 | dense: 0.30 iso: 0.25 | dense: 0.30 iso: 0.25 |
| 2 | TBAOTf | -20 | -0.74 | 0.9 | dense: 1.8 iso: 1.8 | dense: 2.0 iso: 2.0 | dense: 18% iso: 14% | dense: 1.0 iso: 0.83 | dense: 0.27 iso: 0.24 | dense: 0.27 iso: 0.24 |
| 3 | TBAOTs | -7 | -0.73 | 0.9 | dense: 1.9 iso: 1.9 | dense: 2.1 iso: 2.1 | dense: 18% iso: 14% | dense: 0.91 iso: 0.94 | dense: 0.27 iso: 0.23 | dense: 0.27 iso: 0.19 |
| 4 | TBAL | 4 | -1.0 | 2.3 | dense: 5.8 iso: 5.7 | dense: 2.5 iso: 2.5 | dense: 22% iso: 14% | dense: 1.56 iso: 0.61 | dense: 0.24 iso: 0.23 | dense: 0.23 iso: 0.22 |
| 5 | TBAOAc | 5 | -0.83 | 2.0 | dense: 4.4 iso: 4.5 | dense: 2.2 iso: 2.3 | dense: 21% iso: 18% | dense: 1.36 iso: 0.76 | dense: 0.24 iso: 0.19 | dense: 0.24 iso: 0.18 |

The foregoing description of the invention is merely illustrative thereof, and it is understood that variations and modifications can be effected without departing from the spirit or scope of the invention as set forth in the following claims.

What is claimed is:

1. A positive photoresist composition comprising:
   1) a resin binder comprising acid labile groups,
   2) a photoacid generator that is an onium compound, a sulfonate compound, a nitrobenzyl ester compound, an s-triazine compound or a halogenated non-ionic compound, and
   3) a photospeed control agent that is selected from the groups consisting of:
      i) a compound of the formula N(R$^1$)$_4$A where each R$^1$ is independently substituted or unsubstituted alkyl, or a substituted or unsubstituted aryl; and A is a counter anion of a halide, a substituted or unsubstituted sulfonate or a substituted or unsubstituted hydroxyalkanoyl; or ii) a phosphonium compound.

2. The photoresist of claim 1 wherein the photoacid generator is a sulfonate salt.

3. The photoresist of claim 1 wherein the photospeed control agent is a phosphonium compound.

4. The photoresist of claim 1 wherein the photoacid generator is selected from the group consisting of:

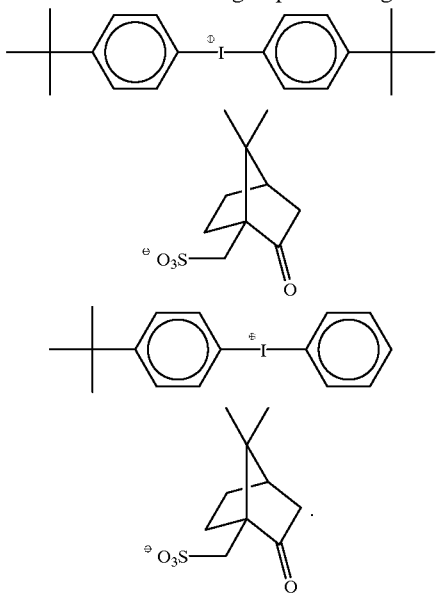

5. The photoresist of claim 1 wherein the resin binder is a phenol-alkyl acrylate copolymer.

6. The photoresist of claim 1 wherein the resin binder comprises units x and y of the structure:

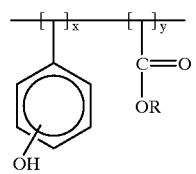

wherein R is substituted or unsubstituted alkyl having 1 to about 18 carbon atoms.

7. A method for controlling photospeed of a chemically amplified positive photoresist, comprising:
   (a) providing a positive photoresist composition comprising a resin binder with acid labile groups, a photoacid generator, and a photospeed control agent;
   (b) determining the photospeed of the photoresist composition, and adjusting the photospeed to a desired value by altering the amount of photospeed control agent in the composition.

8. The method of claim 7 wherein an additional amount of the photospeed control agent is added to the composition to adjust the photospeed.

9. The method of claim 7 wherein the photospeed control agent has a pK$_a$ of about 10 or greater in non-salt form.

10. The method of claim 7 wherein the photospeed control agent is selected from the group consisting of:
    1) a compound of the formula N(R$^1$)$_4$A where each R$^1$ is independently substituted or unsubstituted alkyl, or a substituted or unsubstituted aryl; and A is a counter anion of a halide, a substituted or unsubstituted sulfonate or a substituted or unsubstituted hydroxyalkanoyl; or
    2) a phosphonium compound.

11. A method for forming a photoresist relief image comprising:
    applying a coating layer of the photoresist composition of claim 1 onto a substrate; and
    exposing and developing the photoresist layer on the substrate to provide a relief image.

12. An article of manufacture comprising a substrate having coated thereon the photoresist composition of claim 1.

13. The article of claim 12 wherein the substrate is a microelectronic wafer.

14. The method of claim 7 wherein the photoacid generator compound is an onium compound, a sulfonate compound, a nitrobenzyl ester compound, an s-triazine compound or a halogenated non-ionic compound.

15. The method of claim 7 wherein the photoacid generator is selected from the group consisting of:

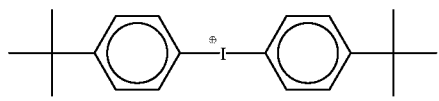

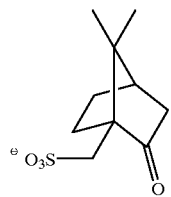

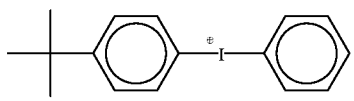

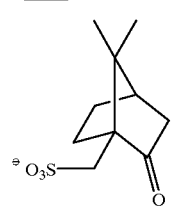

16. The method of claim 7 wherein the resin binder is a phenol-alkyl acrylate copolymer.

17. The method of claim 7 wherein the resin binder comprises units x and y of the structure:

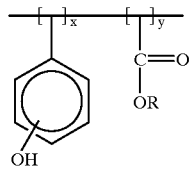

wherein R is substituted or unsubstituted alkyl having 1 to about 18 carbon atoms.

18. The method of claim 7 wherein the photospeed control agent is a sulfonate salt.

19. The method of claim 7 wherein the photospeed control agent is a phosponium compound.

20. A positive photoresist composition comprising:

1) a resin binder comprising acid labile groups, 2) a photoacid generator that is other than a diazoguinone, and 3) a photospeed control agent that is selected from the groups consisting of:

i) a compound of the formula $N(R^1)_4A$ where each $R^1$ is independently substituted or unsubstituted alkyl, or a substituted or unsubstituted aryl; and A is a counter anion of a halide, a substituted or unsubstituted sulfonate or a substituted or unsubstituted hydroxyalkanoyl; or ii) a phosphonium compound.

* * * * *